United States Patent [19]
Tsinker

[11] Patent Number: 5,939,929
[45] Date of Patent: Aug. 17, 1999

[54] LOW JITTER LOW POWER SINGLE ENDED DRIVER

[75] Inventor: Vadim Tsinker, Beemont, Calif.

[73] Assignee: Advanced Micro Devices, Inc., Sunnyvale, Calif.

[21] Appl. No.: 08/962,968

[22] Filed: Oct. 27, 1997

Related U.S. Application Data

[63] Continuation of application No. 08/524,338, Sep. 6, 1995, abandoned.

[51] Int. Cl.[6] .......................... H03K 17/16; H03K 17/687
[52] U.S. Cl. .......................... 327/391; 327/437; 327/108; 375/317
[58] Field of Search .................................. 327/108, 310, 327/313, 381, 383, 389, 391, 437; 375/257, 317, 318, 319, 219

[56] References Cited

U.S. PATENT DOCUMENTS

| | | | |
|---|---|---|---|
| 4,564,879 | 1/1986 | Bienstman | 330/207 |
| 4,914,317 | 4/1990 | Agiman | 327/108 |
| 5,109,170 | 4/1992 | Huijsing et al. | 327/538 |
| 5,124,570 | 6/1992 | Meno et al. | 327/108 |
| 5,248,906 | 9/1993 | Mahmood | 326/27 |
| 5,296,754 | 3/1994 | Yoshinaga | 327/362 |
| 5,471,498 | 11/1995 | Kuo | 330/310 |
| 5,502,405 | 3/1996 | Williams | 326/66 |
| 5,517,143 | 5/1996 | Gross | 327/307 |
| 5,543,745 | 8/1996 | Notani | 327/538 |

*Primary Examiner*—Timothy P. Callahan
*Assistant Examiner*—Terry L. Englund
*Attorney, Agent, or Firm*—Fliesler, Dubb, Meyer & Lovejoy LLP

[57] ABSTRACT

An output driver circuit for use with ethernet repeaters is disclosed which produces a symmetric (low jitter) output signal in response to an input signal. The circuit further exhibits low ground bounce by maintaining an output level swing of between 1.5 and 1.8 volts. When not transmitting, the driver provides power savings by maintaining a half level signal at its output.

17 Claims, 3 Drawing Sheets

LOW JITTER LOW POWER SINGLE ENDED DRIVER

This application is a File Wrapper Continuation of Ser. No. 08/524,338, filed Sep. 6, 1995, now abandoned.

FIELD OF THE INVENTION

The present invention relates generally to output driver circuits, and more particularly to a single ended driver circuit for use with ethernet repeaters.

BACKGROUND OF THE INVENTION

In ethernet communication networks, repeaters are used to transfer information through the network. Driver circuits are an integral component of ethernet repeaters. A standard driver, such as the one used in Attachment Unit Interfaces (AUI), is a large differential driver capable of transmitting information over a long cable. A drawback with conventional drivers is that they require large pin counts, large die space and consume most of the available on-chip power. These become increasingly serious problems as the level of integration on integrated circuit (IC) chips increases.

SUMMARY OF THE INVENTION

The present invention solves the aforementioned and related problems associated with conventional AUI driver circuits. Disclosed herein is a single ended driver that produces a symmetrical (low jitter) signal, while at the same time uses less power than conventional AUI driver circuits. The driver consists of input means for receiving a signal, output means for delivering the input signal, current means connected to the input means and the output means for maintaining a stable signal and enabling means to tristate the driver from a larger network.

An advantage of the present invention is the reduction in the number of pins in the chip package.

Another advantage of the present invention is that it consumes less power than conventional driver circuits.

A further advantage of the present invention is the ability to maintain low ground bounce of the output signal.

Still another advantage of the present invention is the ability to maintain the symmetry of the output signal.

BRIEF DESCRIPTION OF THE DRAWINGS

These and other advantages and features of the present invention will become apparent from the following description of the preferred embodiment, taken in conjunction with the accompanying drawings, where like numbers represent like elements, in which.

DETAILED DESCRIPTION OF THE PREFERRED EMBODIMENT

Figure 1:
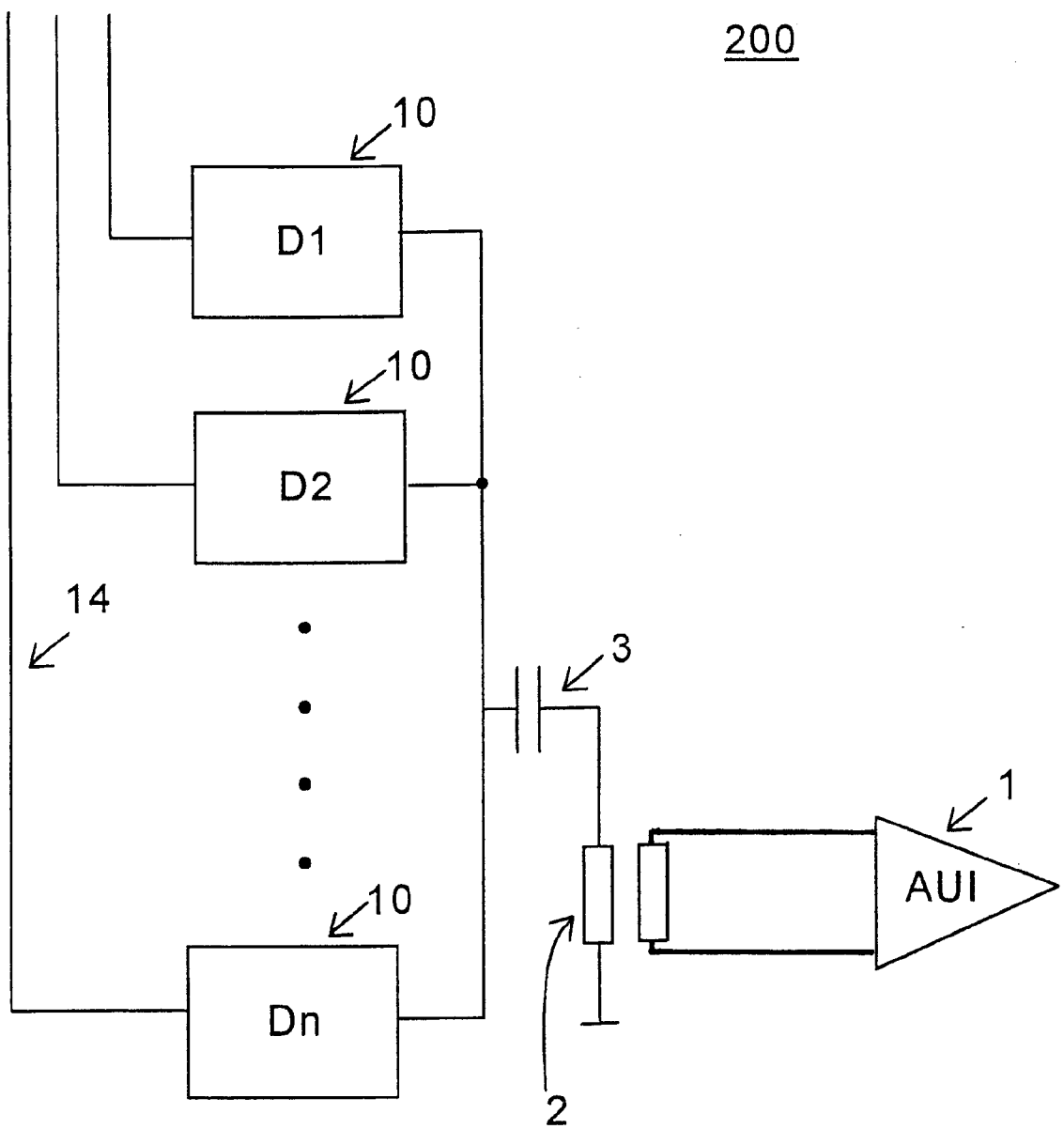
FIG. 1 is a block diagram of a multiple group network using the driver of the present invention.

FIG. 1 shows a communication network 200 using the single ended driver circuit of the present invention. A plurality of repeaters (D1–Dn) incorporating the driver of the present invention 10 are each connected to a respective expansion bus line 14 extending from an ethernet network. The outputs of the repeater driver circuits 10 are coupled to an attachment unit interface (AUI) 1 via a decoupling capacitor 3 connected in series with an external transformer 2, which outputs a differential waveform signal. The advantage of using this type of network is that if one repeater driver 10 (labelled D1) is busy, the network can then switch to another repeater driver 10 (labelled Dn) which is not as busy, thus enhancing data throughput.

Figure 2:
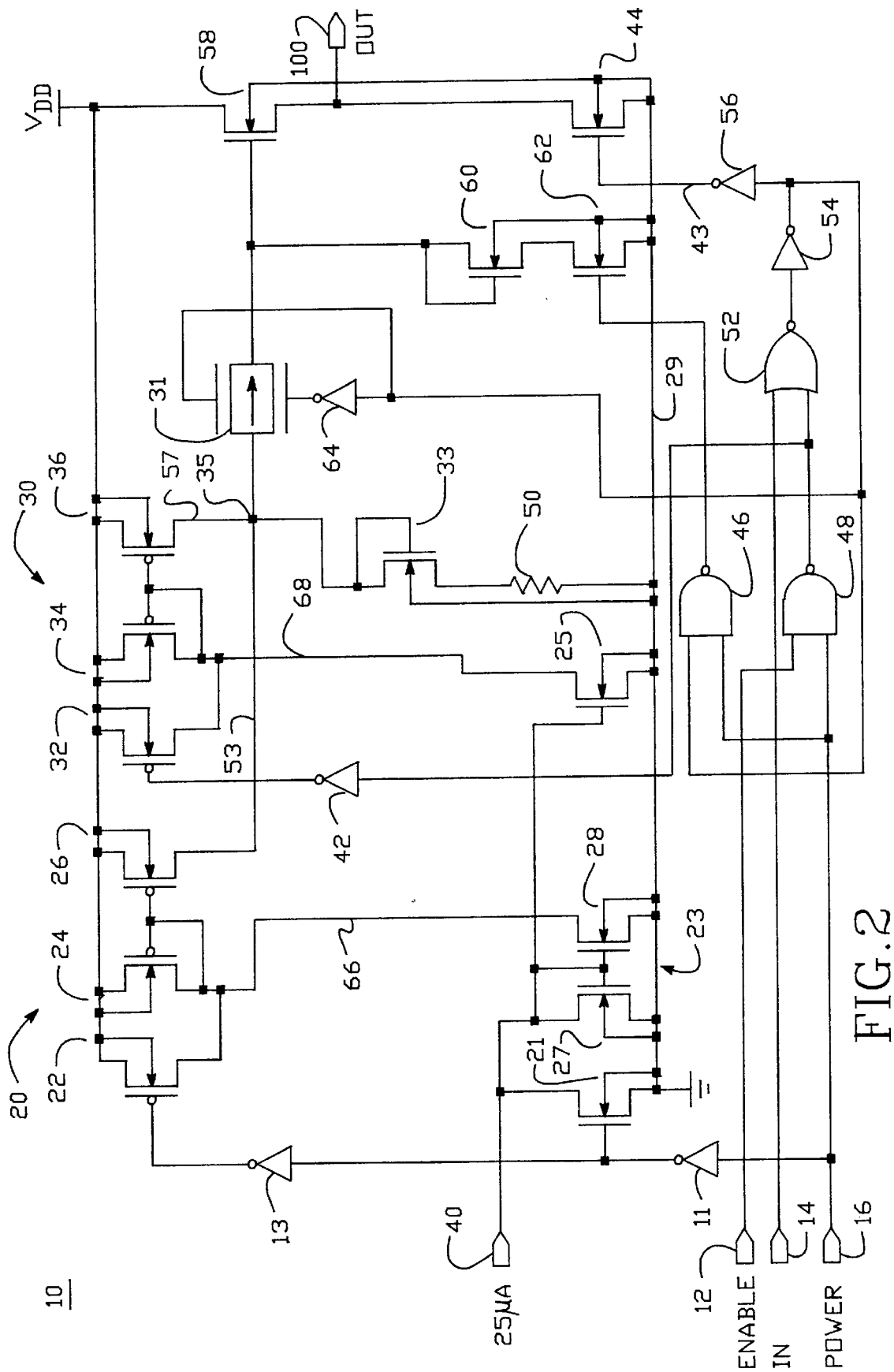
FIG. 2 is a schematic diagram of the driver according to the preferred embodiment of the present invention.

FIG. 2 shows a schematic diagram of the single ended driver circuit located within the repeater 10 according to the preferred embodiment of the present invention. An IN signal 14 is provided to the driver which contains the data transmitted over the expansion bus (FIG. 1). When the IN signal 14 consists of valid data, the enable line 12 is asserted and is provided as a first input to a NAND gate 48. The second input to the NAND gate 48 is provided by the power signal on line 16. The power signal on line 16 is also coupled to the gate of a first control transistor 22 via inverters 11 and to 13, and to the control gate of a current mirror control transistor 21 via inverter 11. When the power signal on line 16 has the value of substantially 0, the driver 10 is tri-stated from the network 200 (FIG. 1), and thus consumes no power.

A first current source 20 is controlled by the power signal present on line 16. The first current source 20 consists of the pMOS control transistor 22 and two pMOS current multiplier transistors 24 and 26, respectively, connected in parallel with the control transistor 22. In the figure, for ease of illustration, the drain of the control transistor 22 is shown coupled to the drain of a single transistor 24. However, in the preferred embodiment of the present invention, the single transistor 24 consists of four parallel connected PMOS transistors having their respective sources connected to positive $V_{DD}$; their respective drains connected to the drain of the control transistor 22; and their respective gates connected to the drain of the control transistor 22 and the gate of the transistor 26. Transistor 26 consists of twenty PMOS transistors connected in parallel with their respective sources coupled to positive $V_{DD}$ and with the drain of the last transistor delivering a one-half level output current signal on line 53. Current source 20 delivers the one-half level output current signal whenever the power signal 16 is asserted. The current signal from the current source 20 is reflected across line 66 by a current mirror 23, which consists of an NMOS transistor 27 with its drain connected to a 25 $\mu$A current source at terminal 40 and its gate coupled to the gate of a transistor 28 which consists of four nMOS transistors connected in parallel with their respective sources coupled to line 29. The gate and drain of NMOS 27 are connected to ground potential whenever the current mirror control transistor 21 is turned on. In the preferred embodiment of the present invention, the 25 $\mu$A current is generated by a band gap voltage reference (not shown).

The second current source 30 consists of a control pMOS transistor 32 and two pMOS transistors 34 and 36, respectively, connected in parallel with one another and also with the control transistor 32. In FIG. 2, for ease of illustration, the transistors 34 and 36 are presented as single transistors. However, in the preferred embodiment of the present invention, transistor 34 consists of four PMOS transistors connected in parallel with one another having their respective sources connected to positive $V_{DD}$ and their respective drains connected to the drain of the control transistor 32. The gates of the transistors 34 are coupled to the drain of the control transistor 32 and also to the gate of the transistor 36 which consists of 20 parallel connected pMOS transistors having their sources coupled to positive $V_{DD}$. With this configuration, the current present on line 57 is equal to five times the current present on line 68 which is reflected by the nMOS transistor 25. The multiplied current present on line 57 is combined with the current from the first current source 20 on line 53 at a node 35 and passed through a resistor 50 via a nMOS transistor 33 thereby producing a voltage at the node 35.

A transfer gate 31 passes the voltage present at the node 35 to the gate of an RMOS output transistor 58 in response to the output of an inverter 64. The output transistor 58 behaves as a source follower to the voltage present at the node 35 and when turned on passes the signal present at node 35 to the output 100 of the driver 10. Also, coupled to the output transistor 58 is a pulldown transistor 44 which pulls the output 100 of the driver 10 to approximately zero in response to a signal on line 43.

In operation, when the driver 10 is not tri-stated or removed from the network, but is not transmitting, the first current source 20, the current mirror 23 and the nMOS transistor 25 are turned on, due to the power signal having the value of 1, thus providing a signal equal to substantially one-half the maximum output voltage at the output 100. This one-half level signal will maintain the output signal symmetry and prevent signal drift, which adversely affects jitter in the output signal. During this condition, the second current source 30 is turned off due to the value of 0 present at its control gate. The one-half level voltage swing is a voltage over the range of at least 0.7 volts to 0.9 volts and optimally 0.8 volts. When the driver 10 is not transmitting, the output transistor 58 is turned on and the pulldown transistor 44 is turned off. The voltage impressed on to the gate of the output transistor 58 is equal to the voltage at the node 35, which consists of the voltage across the resistor 50 ($V_{R50}$) and the voltage gain to source ($V_{gs}$) of the transistor 33 which is turned on whenever there is current present on either lines 53 or 57. Since the output transistor 58 and the nMOS transistor 33 are approximately matched, their $V_{gs}$ are substantially the same and the voltage at the output 100 is approximately equal to the voltage at the top of the resistor 50.

When the driver 10 is transmitting the signal present on the IN line 14, a voltage range of at least 1.5 volts to 1.8 volts, and optimally 1.65 volts is maintained at the output 100 by having both current source 20 and current source 30 turned on. This occurs because both the power line 16 and the enable line 12 have the value of 1. When the value of the IN line 14 is high, the output transistor 58 is turned on and the voltage at the node 35 is connected to the gate of the output transistor 58 via the transfer gate 31. When the value of the power line signal 16 is high and the enable signal 12 is high, the pulldown transistor 44, which decouples the output 100 from the network 200 (FIG. 1) is disabled. Thus, the value at the output 100 is controlled by the output transistor 58 which is turned on because the transfer gate 31 has been activated. When the transfer gate 31 is activated, the voltage present at the node 35 is passed to the gate of the output transistor 58. When a low value is present on the IN line 14, the output transistor 58 is turned off, and the pulldown transistor 44 and the nMOS transistor 62 are turned on thereby driving the output 100 of the driver 10 to approximately 0 volts. By utilizing such a low voltage swing (0V–1.8V), the driver 10 consumes less on chip power than conventional drivers and maintains a low ground bounce.

When the driver 10 is disconnected from the network 200 (FIG. 1) or is in the tri-state mode, the signal on the power line 16 has a value of substantially 0, the output transistor 58 and the pulldown transistor 44 are turned off and the nMOS transistor 62 is turned on, thus tri-stating the driver 10 and thereby saving power. The two current sources 20 and 30 are also disabled because the control transistors 22 and 32 have no voltage present on their respective gates. The current mirrors 23 and 25 are also disabled because the current mirror control transistor 21 is turned on, thereby coupling their respective gates to ground. With the driver being completely tri-stated, wired OR operations are possible which are necessary for ethernet port mobility where the output 100 is coupled. The transfer gate 31 which connects the voltage at the node 35 to the output transistor 58 is turned on when the signal present on the power line 16 is substantially 0; however, the NMOS transistor 62 is also enabled which pulls the voltage transmitted through the transfer gate 31 low since the current sources are disabled.

Figure 3:
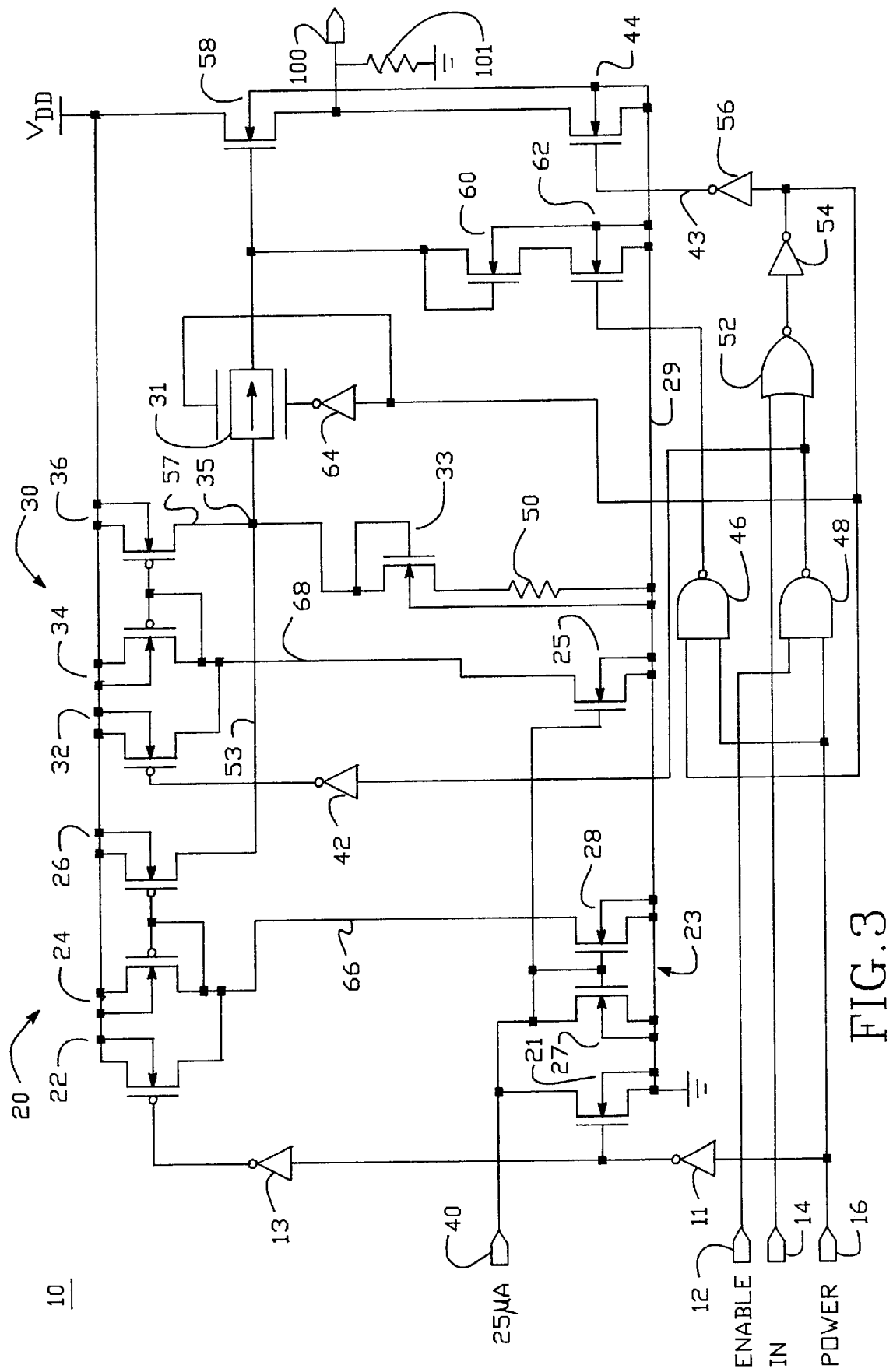
FIG. 3 is a schematic diagram of the driver including an external resistor according to the present invention.

FIG. 3 illustrates the single ended driver 10 of the present invention including an external resistor 101. The circuit components of the embodiment illustrated in FIG. 3 are the same as shown in FIG. 2, except an external matching resistor 101 is coupled to the output 100. The function of the matching resistor 101 is to substantially match the output current with that of the nMOS transistor 33 so that the $V_{gs}$ of the nMOS transistor 33 and the voltage present at the gate of the output transistor 58 will be the same.

The foregoing description of the preferred embodiment of the present invention has been presented for purposes of illustration and description. It is not intended to be exhaustive or to limit the invention to the precise form disclosed, and obviously many modifications and variations are possible in light of the above teaching. The single ended driver was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An output driver circuit, comprising:
   an input terminal for receiving an input signal;
   an output terminal for delivering an output signal;
   switching circuitry coupled to said input terminal, for providing an enablement control signal; and
   a plurality of current sources coupled to said output terminal;
   wherein:
   one of said plurality of current sources providing a first constant current that produces a first signal at said output terminal during non-enabled operation of said driver circuit;
   upon activation of said enablement control signal, said driver circuit is placed in an enabled operation, wherein,
   a second one of said plurality of current sources provides a second constant current, and
   said second constant current is combined with said first constant current to produce a second signal replacing said first signal at said output terminal; and
   said second signal being symmetric to said first signal.

2. The output driver circuit of claim 1, further comprising output circuitry operative to place said output terminal into a high impedance state during non-operation of said driver circuit.

3. The output driver circuit of claim 1 further comprising output circuitry operative to pull the signal at said output terminal to zero.

4. The output driver circuit of claim 1, wherein each of said first and second constant currents produce one-half of said second signal.

5. The output driver circuit of claim 1, wherein each of said plurality of current sources comprises at least one current source coupled to a current multiplier.

6. The output driver circuit of claim 4, further comprising a transfer gate operative to pass a voltage generated by the combined first and second constant currents to said output terminal as said second signal.

7. A single ended output driver circuit, comprising:
   an input terminal for receiving an input signal;
   an output terminal for delivering an output signal comprising one of a first signal and a second signal;
   a first current source, coupled to said output terminal, for providing said first signal to said output terminal;
   a second current source, coupled to said output terminal, for providing in conjunction with said first current source, said second signal to said output terminal;
   output circuitry coupled to said input and output terminals and operative to place said output terminal into a high impedance state; and
   switching circuitry for providing a control signal coupled to said second current source and used to control the provision of said second signal to said output terminal;
   wherein:
   said first signal is supplied to said output terminal and, upon application of said control signal, said second signal replaces said first signal at said output terminal; and
   said first signal being symmetric to said second signal.

8. The single ended output driver circuit of claim 7, further comprising:
   a transfer gate, responsive to said control signal, for passing a first voltage generated by said first current source and a second voltage generated by said first and second current sources to said output terminal as said first and second signals.

9. The single ended output driver circuit of claim 8, wherein said output circuitry is further configured to pull said output terminal to substantially zero.

10. The single ended output driver circuit of claim 7, wherein each of said current sources includes a respective current multiplier.

11. The output driver circuit of claim 7, wherein said first signal has a magnitude equal to about one-half the total output magnitude of the second signal of the output driver circuit.

12. The output driver circuit of claim 7, wherein said first signal is a one-half level signal and said second signal is a full level signal.

13. The output driver circuit of claim 7, wherein said second signal has a value between approximately 0.8V and 1.8V.

14. The output driver circuit of claim 7, wherein said second signal has a value of approximately 1.65V.

15. The output driver circuit of claim 7, wherein said second signal has a value between 0V and 1.8V.

16. The single ended output driver circuit of claim 7, wherein said first signal has the value of approximately 0.8V.

17. The single ended output driver circuit of claim 7, wherein said second signal has a value between approximately 1.65V and 1.8V.

* * * * *